United States Patent
Kose

(10) Patent No.: US 7,861,134 B2
(45) Date of Patent: Dec. 28, 2010

(54) METHODS AND SYSTEMS FOR LDPC CODING

(76) Inventor: Cenk Kose, 7975 Avenida Navidad, Apt 323, San Diego, CA (US) 92122

(*) Notice: Subject to any disclaimer, the term of this patent is extended or adjusted under 35 U.S.C. 154(b) by 974 days.

(21) Appl. No.: 11/680,612

(22) Filed: Feb. 28, 2007

(65) Prior Publication Data

US 2008/0204286 A1    Aug. 28, 2008

(51) Int. Cl.
*H03M 13/00* (2006.01)
(52) U.S. Cl. .................. 714/755; 714/786; 714/790
(58) Field of Classification Search ............ 714/755, 714/786, 807, 779, 776, 774, 790
See application file for complete search history.

(56) References Cited

U.S. PATENT DOCUMENTS

| 2006/0218459 A1 | 9/2006 | Hedberg | |
| 2007/0041458 A1 | 2/2007 | Hocevar et al. | |
| 2007/0143656 A1* | 6/2007 | Niu et al. | 714/752 |

OTHER PUBLICATIONS

International Search Report and Written Opinion, dated Jul. 22, 2008.
Baldi, Marco et al., "Variable Rate LDPC Codes for Wireless Applications" Software in Telecommunications and Computer Networks, 2006. Softcom 2006; Oct. 1, 2006, 5 pages.
Blahut, R.E., "Theory and Practice of Error Control Codes, Section 3.5 Perfect and Quasi-Perfect Codes," 1983, Addison Wesley, pp. 56-58.
Supplementary European Search Report for EP Application 08730110.7, dated May 27, 2010.

* cited by examiner

*Primary Examiner*—Guy J Lamarre

(57) ABSTRACT

Methods and systems of low density parity check coded (LDPCC) coding are disclosed herein in which a set of LDPC codes ensure reliable transmission for channels in which modulation symbols may undergo attenuation in a random fashion. Methods and systems of LDPC coding disclosed herein include choosing a code blocklength and concatenating codewords into which a data packet can be encoded. To optimize the coding scheme, first, codeword shortening is performed to ensure an integer number of codewords for a desired packet length. The codewords may then be punctured or repeated to ensure an integer number of channel symbols per codeword. Shortening and puncturing repetition methods are implemented to yield minimum overhead while keeping the effective coding rate low.

36 Claims, 11 Drawing Sheets

$$P_5 = \begin{pmatrix} 0 & 0 & 1 & 0 & 0 & 0 & 0 & 0 \\ 0 & 1 & 0 & 0 & 0 & 0 & 0 & 0 \\ 1 & 0 & 0 & 0 & 0 & 0 & 0 & 0 \\ 0 & 0 & 0 & 0 & 0 & 0 & 0 & 1 \\ 0 & 0 & 0 & 0 & 0 & 0 & 1 & 0 \\ 0 & 0 & 0 & 0 & 0 & 1 & 0 & 0 \\ 0 & 0 & 0 & 0 & 1 & 0 & 0 & 0 \\ 0 & 0 & 0 & 1 & 0 & 0 & 0 & 0 \end{pmatrix}$$

$$P_1 = \begin{pmatrix} 0 & 0 & 0 & 0 & 0 & 0 & 1 & 0 \\ 0 & 0 & 0 & 0 & 0 & 1 & 0 & 0 \\ 0 & 0 & 0 & 0 & 1 & 0 & 0 & 0 \\ 0 & 0 & 0 & 1 & 0 & 0 & 0 & 0 \\ 0 & 0 & 1 & 0 & 0 & 0 & 0 & 0 \\ 0 & 1 & 0 & 0 & 0 & 0 & 0 & 0 \\ 1 & 0 & 0 & 0 & 0 & 0 & 0 & 0 \\ 0 & 0 & 0 & 0 & 0 & 0 & 0 & 1 \end{pmatrix}$$

$$P_0 = \begin{pmatrix} 0 & 0 & 0 & 0 & 0 & 0 & 0 & 1 \\ 0 & 0 & 0 & 0 & 0 & 0 & 1 & 0 \\ 0 & 0 & 0 & 0 & 0 & 1 & 0 & 0 \\ 0 & 0 & 0 & 0 & 1 & 0 & 0 & 0 \\ 0 & 0 & 0 & 1 & 0 & 0 & 0 & 0 \\ 0 & 0 & 1 & 0 & 0 & 0 & 0 & 0 \\ 0 & 1 & 0 & 0 & 0 & 0 & 0 & 0 \\ 1 & 0 & 0 & 0 & 0 & 0 & 0 & 0 \end{pmatrix}$$

| $N_{avbits}$ Range (bits) | Number of LDPCC codewords $N_{CW}$ | LDPC codeword length $L_{LDPC}$ (bits) |
|---|---|---|
| $N_{avbits} \leq 648$ | 1 | 1296, if $N_{avbits} \geq N_{pld} + 912 \times (1-R)$<br>648, otherwise |
| $648 < N_{avbits} \leq 1296$ | 1 | 1944, if $N_{avbits} \geq N_{pld} + 1464 \times (1-R)$<br>1296, otherwise |
| $1296 < N_{avbits} \leq 1944$ | 1 | 1944 |
| $1944 < N_{avbits} \leq 2592$ | 2 | 1944, if $N_{avbits} \geq N_{pld} + 2916 \times (1-R)$<br>1296, otherwise |
| $2592 < N_{avbits}$ | $\text{ceil}(N_{pld}/(1944 \times R))$ | 1944 |

| 7  | -  | -  | -  | 20 | -  | 50 | 34 | -  | -  | 33 | 39 | 41 | 45 | 39 | 19 | 8  | 46 | 1 | 0 | -  | -  | -  | -  | -  |
|----|----|----|----|----|----|----|----|----|----|----|----|----|----|----|----|----|----|---|---|----|----|----|----|----|
| -  | 41 | 0  | -  | -  | 25 | -  | 14 | -  | 11 | 44 | 11 | 35 | 41 | 14 | 17 | 40 | 50 | - | 0 | 0  | -  | -  | -  | -  |
| -  | -  | -  | 38 | -  | 31 | -  | -  | 32 | 33 | 16 | 4  | 1  | 43 | 0  | 13 | 20 | 45 | - | - | 0  | 0  | -  | -  | -  |
| -  | -  | 13 | -  | -  | -  | 10 | -  | 30 | 32 | 0  | 36 | 29 | 26 | 1  | 39 | 23 | 36 | 0 | - | -  | 0  | 0  | -  | -  |
| -  | -  | -  | -  | -  | -  | -  | -  | -  | 47 | 3  | 6  | 43 | 8  | 36 | 53 | 16 | -  | - | - | -  | -  | 0  | 0  | -  |
| -  | 38 | 27 | 45 | -  | 30 | -  | -  | -  | -  | -  | 24 | 1  | 14 | 16 | 21 | 41 | 11 | 0 | - | -  | -  | -  | 0  | 0  |
| 11 | -  | -  | -  | 44 | 10 | 27 | 3  | -  | -  | -  | -  | -  | -  | -  | -  | -  | -  | 1 | - | -  | -  | -  | -  | 0  |

Figure 10

| 8 | – | – | – | 50 | – | 51 | 53 | – | 36 | – | 40 | 20 | 25 | 39 | 3 | 71 | 74 | 1 | 0 | – | – | – | – |
| – | 29 | 17 | 25 | – | – | – | 16 | – | 29 | 23 | 43 | 10 | 44 | 6 | 12 | 61 | – | – | 0 | – | – | – | – |
| 37 | – | 63 | – | 57 | 3 | – | – | – | 13 | 54 | 55 | 45 | 49 | 22 | 57 | – | 0 | 0 | – | 0 | – | – | – |
| – | 45 | – | 12 | – | – | – | – | – | – | 77 | 49 | 45 | 19 | 63 | 78 | 4 | 0 | – | – | – | 0 | – | – |
| – | 36 | – | – | – | – | 28 | – | – | 0 | 13 | – | 2 | 65 | 66 | 32 | 7 | 55 | – | 0 | 0 | – | 0 | 0 |
| – | – | 1 | 31 | – | 26 | – | 49 | – | 32 | 26 | 73 | 51 | 49 | 9 | 53 | 1 | – | – | – | – | – | 0 | 0 |
| 13 | – | – | – | – | – | – | – | – | – | – | – | – | – | – | – | – | – | – | – | – | – | – | – |
| 12 | – | – | – | – | – | – | – | – | – | – | – | – | – | – | – | – | – | – | – | – | – | – | – |

Figure 11

METHODS AND SYSTEMS FOR LDPC CODING

BACKGROUND

1. Field of the Invention

The present disclosure is generally related to digital communications and, more particularly, is related to systems and methods for encoding digital communications.

2. Related Art

Communication networks come in a variety of forms. Notable networks include wireline and wireless. Wireline networks include local area networks (LANs), digital subscriber line (DSL) networks, and cable networks, among others. Wireless networks include cellular telephone networks, classic land mobile radio networks and satellite transmission networks, among others. These wireless networks are typically characterized as wide area networks. More recently, wireless local area networks and wireless home networks have been proposed, and standards, such as Bluetooth and IEEE 802.11, have been introduced to govern the development of wireless equipment for such localized networks.

A wireless local area network (LAN) typically uses infrared (IR) or radio frequency (RF) communications channels to communicate between portable or mobile computer terminals and stationary access points or base stations. These access points are, in turn, connected by a wired or wireless communications channel to a network infrastructure which connects groups of access points together to form the LAN, including, optionally, one or more host computer systems.

Wireless protocols such as Bluetooth and IEEE 802.11 support the logical interconnections of such portable roaming terminals having a variety of types of communication capabilities to host computers. The logical interconnections are based upon an infrastructure in which at least some of the terminals are capable of communicating with at least two of the access points when located within a predetermined range, each terminal being normally associated, and in communication, with a single one of the access points. Based on the overall spatial layout, response time, and loading requirements of the network, different networking schemes and communication protocols have been designed so as to most efficiently regulate the communications.

IEEE Standard 802.11 ("802.11") is set out in "Wireless LAN Medium Access Control (MAC) and Physical Layer (PHY) Specifications" and is available from the IEEE Standards Department, Piscataway, N.J. 802.11 permits either IR or RF communications at 1 Mbps, 2 Mbps and higher data rates, a medium access technique similar to carrier sense multiple access/collision avoidance (CSMA/CA), a power-save mode for battery-operated mobile stations, seamless roaming in a full cellular network, high throughput operation, diverse antenna systems designed to eliminate "dead spots," and an easy interface to existing network infrastructures.

The 802.11a standard defines data rates of 6, 12, 18, 24, 36 and 54 Mbps in the 5 GHz band. Demand for higher data rates may result in the need for devices that can communicate with each other at the higher rates, yet co-exist in the same WLAN environment or area without significant interference or interruption from each other, regardless of whether the higher data rate devices can communicate with the 802.11a devices. It may further be desired that high data rate devices be able to communicate with the 802.11a devices, such as at any of the standard 802.11a rates.

A wireless channel may subject the transmitted signals to severe and time-varying attenuation of random nature. For this reason, channel coding, or error correction coding (ECC), which introduces precomputed redundancy on a raw information bit stream, is an integral part of a baseband processor for a wireless modem. A class of channel codes, known as low-density parity-check codes (LDPCCs) achieves this error correction coding in a manner that is close to theoretical limits. An LDPC code includes parameters (n,k) where n is the block length (# bits) and k is the number of information bits encoded per block. Traditional block encoders add a fixed number of parity bits, $m=n-k$, to each block of k information bits to form an n-bit encoded block with code rate $R=k/n$.

For a given rate, the error correcting capability of an LDPC code improves with the blocklength, n. LDPC codes are typically decoded via an iterative algorithm, which improves the reliability of bit decisions at each pass. With each iteration, the performance of the decoder improves, with the improvement diminishing as more and more number of iterations are performed. After a number of iterations, the performance of the decoder ceases to improve for all practical purposes, and the decoder is said to have "converged." The number of iterations required for convergence is a property of the code itself, as well as the specific channel for which it is used. The decoder performance of the LDPC code is thus a function of the number of iterations that can be performed. For a given encoder rate R, the upper limit for a decoding iteration is governed by the number of parity bits, determined by the equation $(1-R) \times n$. Therefore, while it is desirable to use an LDPC code with as large a blocklength as possible, higher blocklengths imply fewer iterations per unit time, which means that the decoder may not harvest the superior error correcting capability of the code. On the other hand, a code with a small blocklength may inherently lack the needed error correcting capability, even if the decoder can implement many fast iterations.

One challenge in a packet-based WLAN radio system, such as, for example, one compliant with 802.11, is to pick an LDPC code block size and a number of iterations to best fit the packet size (total number of available coded bits) while balancing the practical complexity of the decoder. As the transmission data rate increases, the decoder must run faster on average to keep up with data flow. For typical LDPC codes of interest, the decoder may use a large degree of parallelism to perform a desired number of decoding iterations on each received soft codeword. Thus the upper limit of decoding speed is governed approximately by the product of the maximum average coded transmission rate, the number of parity bits per block $(1-R) \times n$, and the number of decoding iterations performed per block. To keep the bit error rate performance (or the code block error rate performance) approximately constant across the packet, the codewords in a packet structure may be of approximately equal size and equal rate. They are decoded using an equal number of decoding iterations. Otherwise the weakest code block in the packet may dominate the overall packet error rate.

Another challenge for the decoder in the WLAN radio is to be able to promptly complete the decoding at the end of reception of a packet so that a return acknowledgement (e.g., ARQ mechanism) can be immediately sent back to the transmitter. Some WLAN radio systems rely on this "ARQ" mechanism to communicate packet errors and instigate retransmission of the packet in the event of an error. The minimum time allowed for this varies according to each transmission standard, but can be as short as 6 μs or so for next generation 802.11 radios. The time between end of reception and the transmission of an acknowledgement is "dead" airtime and thus contributes to network overhead. Therefore, the minimum interframe transmission time (SIFs) for acknowledgement may be optimized in the standard to be as short as possible within practical constraints.

Increasing the data rate and allowing more effective use of bandwidth for devices operating in these bands enables more efficient communications. A higher data rate may enable service providers to more effectively use their allotted spectrum. Consumers may realize a cost savings as well.

SUMMARY

Embodiments of the present disclosure provide a system and method for low density parity check (LDPC) coding. Briefly described, in architecture, one embodiment of the system, among others, can be implemented as follows: a processor configured to compute a number of available bits in a plurality of orthogonal frequency-division multiplexed (OFDM) codewords in which data bits of a packet may fit; compute an integer number of low density parity check coded (LDPCC) codewords to be transmitted, and the length of the LDPCC codewords to be used; compute a number of shortening bits to be padded to the data bits before encoding into the LDPCC codewords; encode the data using the number of shortening bits per LDPCC codeword; compute a number of the data bits to be punctured from the codewords after encoding into the LDPCC codewords; re-encode the data bits using the number of puncture bits per LDPCC codeword; and effect the transmission of the encoded LDPCC codewords.

Embodiments of the present disclosure can also be viewed as providing methods for LDPC coding. In this regard, one embodiment of such a method, among others, can be broadly summarized by the following steps: computing a number of available bits in a plurality of orthogonal frequency-division multiplexed (OFDM) codewords in which data bits of a packet may fit; computing an integer number of low density parity check coded (LDPCC) codewords to be transmitted and a length of the LDPCC codewords to be used; computing a number of shortening bits to be padded to the data bits before encoding into the LDPCC codewords; encoding the data bits using the number of shortening bits per LDPCC codeword; computing a number of the data bits to be punctured from the LDPCC codewords after encoding into the LDPCC codewords; re-encoding the data bits using the number of puncture or repeat bits per LDPCC codeword; and transmitting the encoded LDPCC codewords.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 7 is a schematic diagram that illustrates exemplary embodiments of cyclic-permutation matrices.

FIG. 8 is a table of exemplary PPDU encoding parameters.

FIG. 9 is a schematic diagram that illustrates an exemplary parity-check matrix for ½ code rates at blocklength n=648 bits.

FIG. 10 is a schematic diagram that illustrates an exemplary parity-check matrix for ⅔ code rates at blocklength n=648 bits.

FIG. 11 is a schematic diagram that illustrates an exemplary parity-check matrix for ¾ code rates at blocklength n=648 bits.

DETAILED DESCRIPTION

Disclosed herein are various embodiments of low density parity check (LDPC) encoding systems and methods. One system embodiment comprises a processor that receives a data signal, encodes it using LDPC encoding, and decreases the decoding latency by shortening a tail-end symbol. The encoding may be done in any type of processor such as a PHY layer processor, though not limited to the PHY layer processor, including, but not limited to, a digital signal processor (DSP), a microprocessor (MCU), a general purpose processor, an application specific integrated circuit (ASIC), among others. A new standard is being proposed, referred to as IEEE 802.11n (the "802.11n proposal"), which is a high data rate extension of the 802.11a standard at 5 GHz. It is noted that, at the present time, the 802.11n proposal is only a proposal and is not yet a completely defined standard. Other applicable standards include Bluetooth, xDSL, other sections of 802.11, etc.

Figure 1:
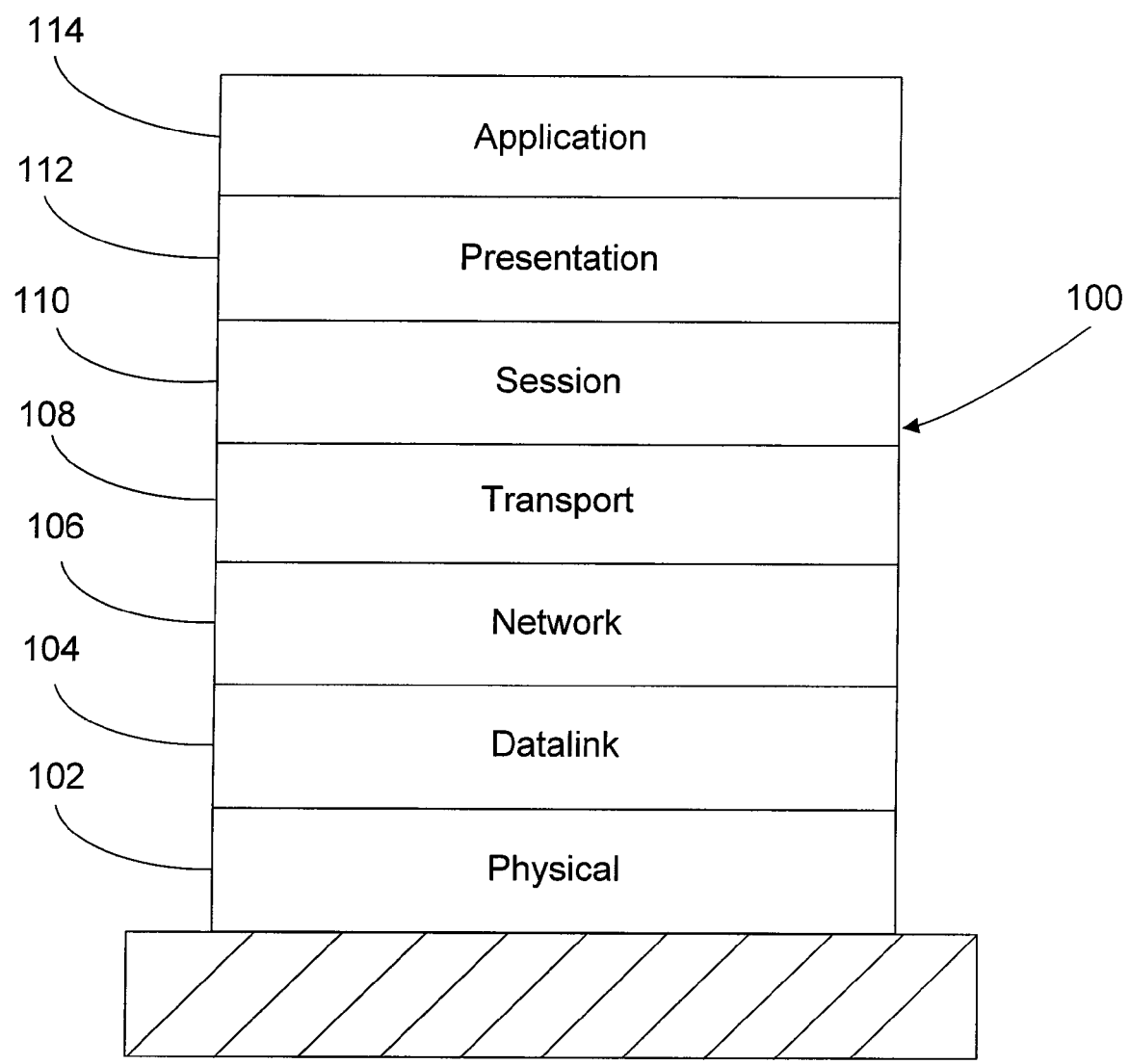
FIG. 1 is a block diagram of an exemplary open system interconnection (OSI) layered model for data transmission.

802.11 is directed to wireless local area networks (WLANs), and, in particular, specifies the MAC and the PHY layers. These layers are intended to correspond closely to the two lowest layers of a system based on the ISO Basic Reference Model of OSI, i.e., the data link layer and the physical layer. FIG. 1 shows a diagrammatic representation of an open systems interconnection (OSI) layered model 100 developed by the International Organization for Standards (ISO) for describing the exchange of information between layers in communication networks. The OSI layered model 100 is particularly useful for separating the technological functions of each layer, and thereby facilitating the modification or update of a given layer without detrimentally impacting on the functions of neighboring layers.

At a lower most layer, the OSI model 100 has a physical layer or PHY layer 102 that is responsible for encoding and decoding data into signals that are transmitted across a particular medium. Above the PHY layer 102, a data link layer 104 is defined for providing reliable transmission of data over a network while performing appropriate interfacing with the PHY layer 102 and a network layer 106. The network layer 106 is responsible for routing data between nodes in a network, and for initiating, maintaining and terminating a communication link between users connected to the nodes. A transport layer 108 is responsible for performing data transfers within a particular level of service quality. A session layer 110 is generally concerned with controlling when users are able to transmit and receive data. A presentation layer 112 is responsible for translating, converting, compressing and decompressing data to be transmitted across a medium. Finally, an application layer 114 provides users with suitable interfaces for accessing and connecting to a network.

Figure 2:
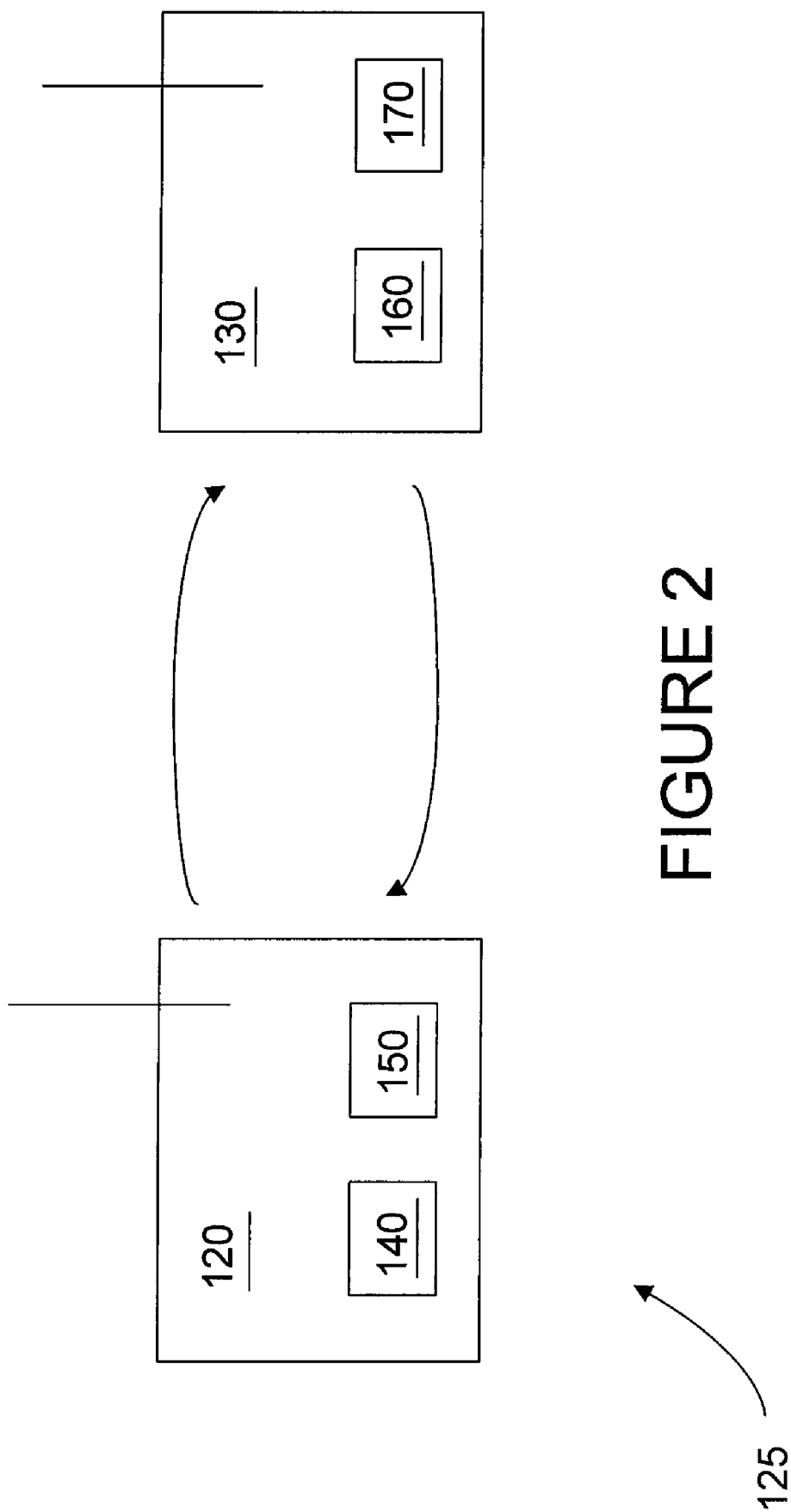
FIG. 2 is a diagram of an exemplary embodiment of a communication system comprising two stations using the OSI model of FIG. 1

This OSI model 100 can be useful for transmissions between, for example, two stations, 120, 130 as shown in FIG. 2. An embodiment of a communication system 125 is shown that provides for LDPC coding, and, in one embodiment, is configured as a wireless ad hoc network (IBSS). An IBSS is a group of 802.11 stations such as stations 120, 130 communicating with one another. In some embodiments, stations 120, 130 comprise encoders 140, 160 and decoders 150, 170, respectively, to perform LDPC encoding and decoding. Alternatively, stations 120, 130 may comprise only encoder 140, 160 or decoder 150, 170. Stations 120, 130 of communication system 125 may comprise transceivers for transmitting and receiving data streams between stations 120, 130, and may include multiple antennas for receiving and/or transmitting. Stations 120, 130 may comprise two client stations or a client station and an AP. Stations 120, 130 do not necessarily have the same number of antennas. Stations 120, 130 may transmit using, as non-limiting examples, a time division multiple access (TDMA) protocol or a Carrier Sense Multiple Access with Collision Avoidance (CSMA/CA) protocol, or a combination of the same and/or other protocols. Although only two stations are provided in this example, the disclosed principles of LDPC coding are also applicable to larger networks with more devices. Certain embodiments of the methods and systems for LDPC coding may also be implemented as a basic service set (BSS). A BSS is a group of 802.11 stations with a central access point (AP). An AP may be the central access point for a plurality of stations in a BSS.

In some embodiments, each station 120, 130 comprises a PHY signal processor configured to implement communications operations, in addition to performing LDPC coding. The communications operations could be co-located in the encoder/decoder or in communication with the encoder/decoder. That is, each PHY signal processor, alone, or in combination with other logic or components, implements the functionality of the various embodiments. Functionality of LDPC coding systems and methods may be embodied in a wireless radio, or other communication device. Such a communication device may include many wireless communication devices, including computers (desktop, portable, laptop, etc.), consumer electronic devices (e.g., multi-media players), compatible telecommunication devices, personal digital assistants (PDAs), or any other type of network devices, such as printers, fax machines, scanners, hubs, switches, routers, set-top boxes, televisions with communication capability, etc.

Embodiments of the present disclosure can be implemented in hardware, software, firmware, or a combination thereof. In exemplary embodiment(s), the methods for LDPC coding in a digital transmission system may be implemented in software or firmware that is stored in a memory and that is executed by a suitable instruction execution system. If implemented in hardware, as in an alternative embodiment, the methods for LDPC coding in a digital transmission system can be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

The LDPC coding program, which may comprise an ordered listing of executable instructions for implementing logical functions, may be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In addition, the scope of the present disclosure includes embodying the functionality of the exemplary embodiments of the present disclosure in logic embodied in hardware or software-configured mediums.

Figure 3:
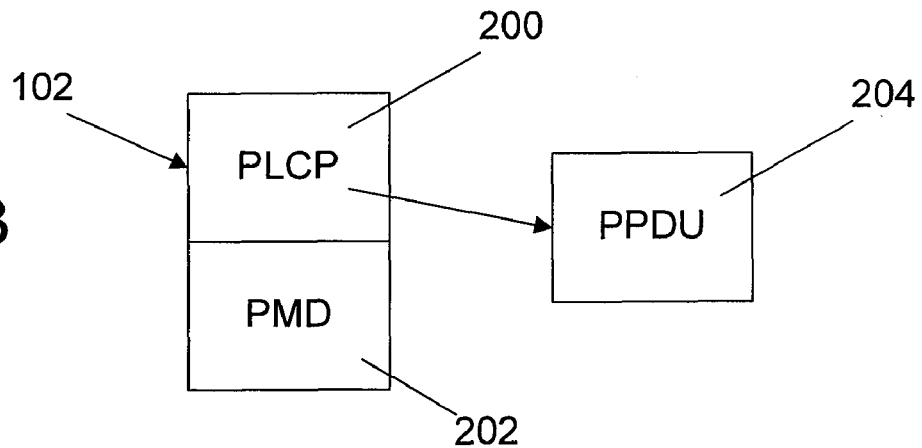
FIG. 3 is a block diagram of an exemplary PHY layer of the OSI layered model of FIG. 1.

As provided in FIG. 3, a block diagram of an exemplary PHY layer 102 is shown. PHY layer 102 includes Physical Layer Convergence Procedure (PLCP) 200 and Physical Medium Dependent (PMD) 202 sub-layers. A PHY layer processor may be configured to perform the functionality of exemplary embodiments described herein.

Figure 4:
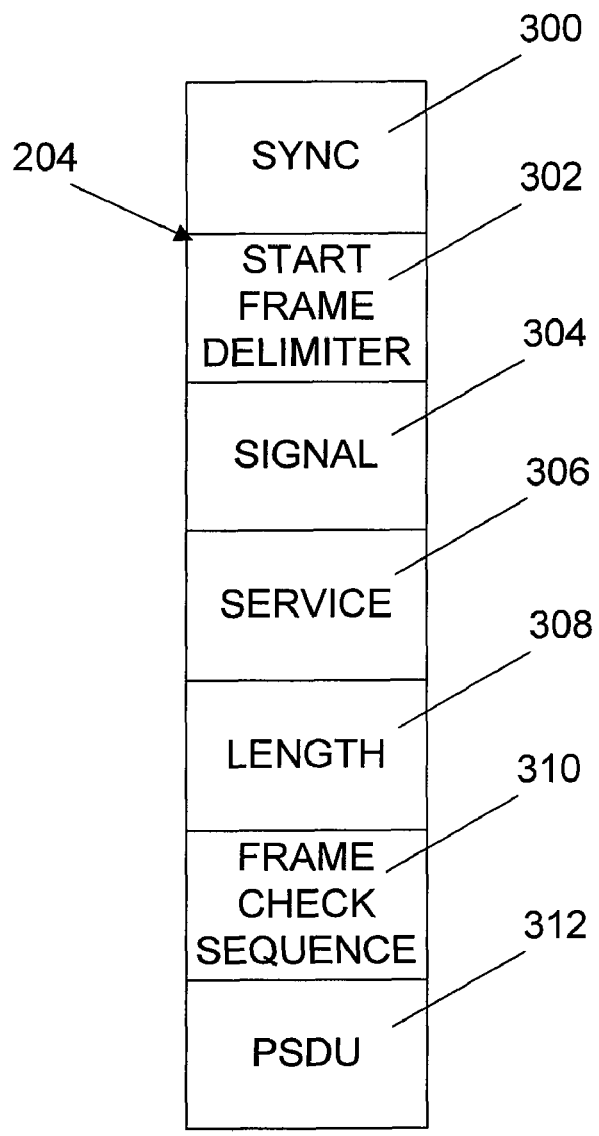
FIG. 4 is a block diagram of an exemplary PPDU layer of the PHY layer of FIG. 3.

As provided in FIG. 4, a block diagram of an exemplary PPDU layer 204 is shown. PPDU layer 204 includes the following fields in addition to the frame fields imposed by the MAC Layer: Sync 300, Start Frame Delimiter 302, Signal 304, Service 306, Length 308, Frame Check Sequence 310, and Physical Layer Service Data Unit 312 (PSDU). Sync field 300 may comprise alternating 0s and 1s, alerting the receiver that a receivable signal is present. The receiver may begin synchronizing with the incoming signal after detecting Sync field 300. Start Frame Delimiter field 302 may be 1111001110100000 and may define the beginning of a frame. Signal field 304 may identify the data rate of the 802.11 frame, with its binary value equal to the data rate divided by 100 Kbps. For example, field 304 may contain the value of 00001010 for 1 Mbps, 00010100 for 2 Mbps, and so on. PLCP 200, however, may be sent at the lowest rate, which is 1 Mbps. This may ensure that the receiver initially uses the correct demodulation mechanism, which may change with different data rates.

Service field 306 may be set to 00000000, and the 802.11 standard reserves it for future use. Length field 308 may represent the number of microseconds that it takes to transmit the contents of PPDU 204, and the receiver may use this information to determine the end of the frame. In order to detect possible errors in the Physical Layer header, the standard defines Frame Check Sequence field 310 for containing a 16-bit cyclic redundancy check (CRC) result. The MAC Layer may also perform error detection functions on PPDU 204 contents as well. PSDU field 312 may represent the contents of the PPDU (i.e., the actual 802.11 frame being sent).

PPDU 204 and, specifically PSDU field 312, may contain the basic packet data units when a data frame is being transmitted. The "payload" is the data size in bytes that a packet will carry. Depending on modulation and coding rates selected for transmission, the amount of coded data that needs to be packed into an orthogonal frequency division multiplexing (OFDM) frame size may vary.

Prior to a transmission, a media access controller (MAC) implemented in data link 104 signals PHY 102 to define the number of payload bytes and the desired modulation, coding, and rate parameters for the transmission. Then, a PPDU encoding algorithm is performed by the PHY processor to determine the actual packet construction parameters to use for the designated PPDU transmission. Packets are composed, transmitted, received, and decoded independently with codeword and OFDM symbol structures that may be different for each packet.

Embodiments disclosed herein may prevent errors due to symbol erasures, i.e., loss of one or more modulation symbols over unfavorable channel conditions. The codeword bits are mapped to frequency domain modulation symbols, and may be sent using a set of orthogonal subcarriers (OFDM) over a wideband channel. In an exemplary embodiment, each carrier can be modeled as an individual channel, and different carriers may have different channel characteristics. Consequently, modulation symbols over different subcarriers may experience different channel conditions. Due to the frequency-selective nature of the wideband channel, some carriers may be weak (unfavorable) while others are stronger (favorable).

Due to the time-varying nature of the channel, the identification of the weaker carriers may not be possible in advance. However, the LDPC codes disclosed herein have been designed to compensate for the random existence and identity of such weak carriers, which may result in complete erasures of modulation symbols. The LDPC coding methods and systems disclosed herein produce reliable transmission even when part of the set of OFDM data subcarriers are completely erased by the channel, as long as the ratio of erased (weak) subcarriers to the total number of data subcarriers is less than (1−R), where R is the rate of the code.

Examples of channels include degenerate channels, flat-fading channels, and additive white Gaussian channels. A degenerate channel erases more symbols than the code can recover from. For example, if more than a quarter of the channels are erased, a rate-¾ code appears as a rate-R>1 code to the decoder. In this case, the decoder cannot reliably recover 486 bits, for example, based solely on information about fewer than 486 bits. A flat-fading channel is a channel in which relative gains of data sub-carriers are constant in the frequency-domain, but not necessarily in the time-domain. In other words, strengths of all sub-carriers are similar. Sometimes they are all weak, sometimes they are all strong. An additive white Gaussian channel is a channel in which relative gains of the data sub-carriers are constant throughout time and frequency, and the additive receiver noise can be modeled as independent and identically distributed samples of a Gaussian random process across data subcarriers.

A data signal may be encoded in PHY layer 102 for transmission. Low density parity check codes (LDPCCs) are block codes with long block length that are used for encoding the data signal. LDPCCs derive performance advantages by virtue of the long block length and code structures, which allow soft iterative decoding to aid decoding decision convergence. Error rate performance may improve with increases in block length and the number of decoding iterations performed.

Since the LDPCC block sizes are typically larger than an OFDM symbol bit carrying capacity, multiple symbols of coded data may be decoded at the end of transmission within the given short inter frame (SIF) latency time. This leads to the decoder accelerating its decoding speed after the end of receipt of the last OFDM symbol in the transmission. A decoder may have more parallelism (higher complexity) if it operates with higher peak speed during the end of transmission decoding. A PPDU encoding algorithm (also sometimes called codeword concatenation algorithm) may minimize the peak to average speed requirement of the decoder. This results in practically efficient use of decoding hardware and minimum complexity.

An LDPC encoding (or concatenation) algorithm as disclosed comprises a process of codeblock size adaptation and codeword shortening to ensure that the end of transmission decoding speed increase can be minimized relative to average speed throughout the packet transmission period. To achieve improved performance with LDPC codes, the decoding process may be iterated. LDPC codes are based on a representation of the process that the decoder employs. The decoder may perform this process for multiple iterations. Typically, to achieve the performance that these codes offer, several decoding iterations may be performed (e.g. ten or twelve). Decoders are designed such that a large number of iterations can be supported. The number of iterations is a variable that may be incorporated into an algorithm and adjusted to control the amount of work that the decoder performs in a given amount of time.

LDPCC decoders have high logic complexity due to the large code block size and the amount of parallelism necessary to process a large maximum number of decoding iterations with shortened packet decoding latency. Conventional implementations may comprise a single code block size. PSDUs are encoded with zero pad bits or fill bits, added as needed, so that an integer number of code blocks and an integer number of OFDM symbols can be transmitted. With the relatively large block size required for LDPC codes (at least 2 k bits) the effective rate loss due to zero padding can be substantial, especially for shorter packets (e.g., less than two kilobytes). For example, a 1 kilobyte block may experience a 20% loss in effective rate or more depending on transmission mode, negatively impacting throughput performance. Decoding latency and, hence, complexity can be reduced if the maximum number of required decoding iterations can be reduced.

Block codes can be constructed such that a fixed number of information bits combined with a fixed number of parity bits are systematic to form the code block. The rate of the code is simply the number of information bits divided by the total block size. The code is more powerful if there are more parity bits per information bit in that block. The rate of the code is determined by how many information bits are present relative to the number of parity bits. The code is normally a fixed block size for a given code rate.

Figure 5:
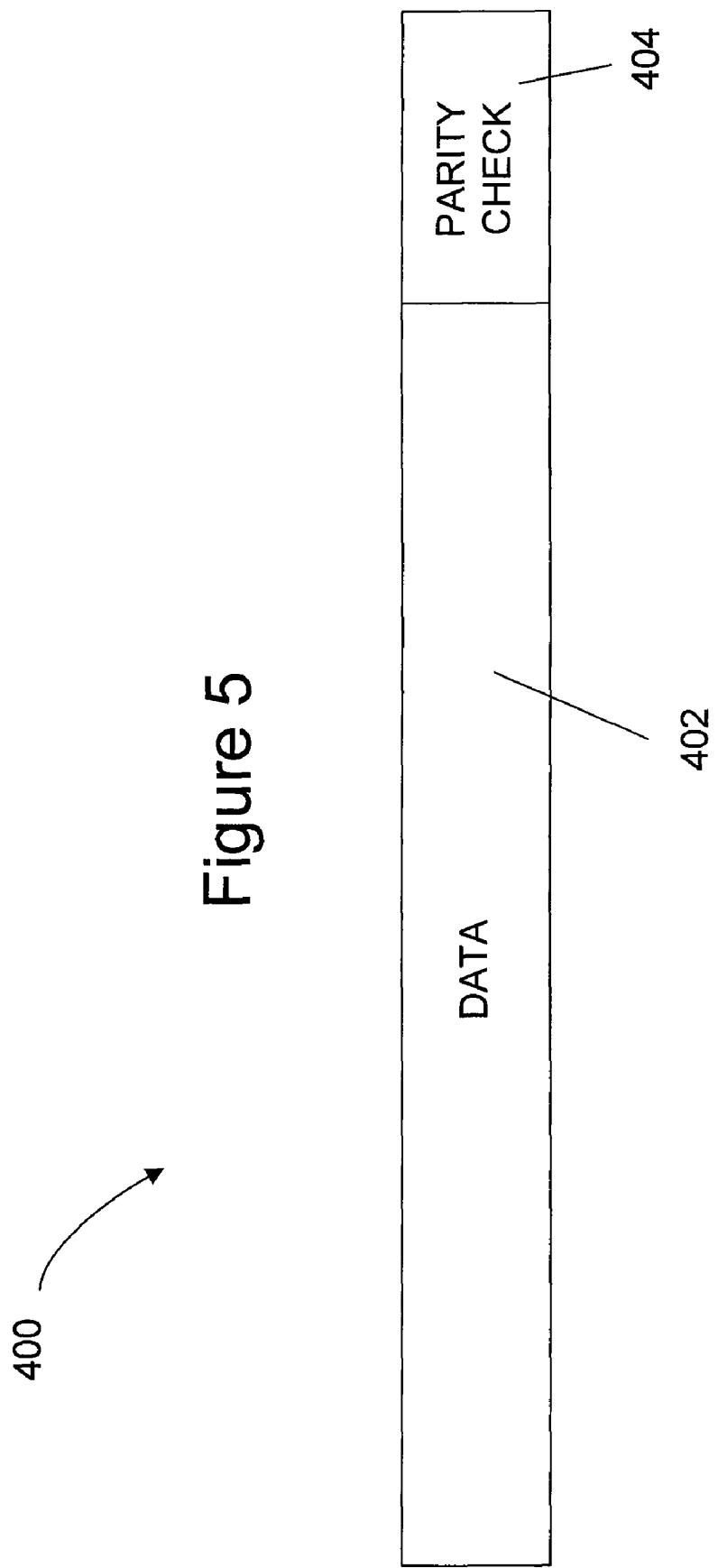
FIG. 5 is a block diagram of an exemplary low density parity check code block.
Figure 6:
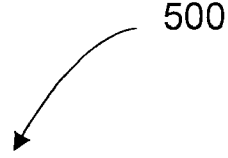
FIG. 6 is a table of exemplary embodiments of code rates, information block lengths, and codeword block lengths for encoding the LDPC code block of FIG. 5.

FIG. 5 provides a block diagram of a full LDPC code block 400 transmitted in three 64 QAM OFDM symbols including data block 402 and parity check block 404. In this nonlimiting example, the entire block 400 is 1944 bits long, with data block 402 comprising 1458 data bits and parity check block 404 comprising 486 bits. This disclosure describes LDPCCs which may be used in a high throughput (HT) system as a high-performance error checking and correcting (ECC) technique, for example, instead of a convolutional code. Exemplary code rates, information block lengths, and codeword block lengths are described in table 500 of FIG. 6.

For each of the three available codeword block lengths, the disclosed LDPCC supports rate-½, rate-⅔, rate-¾, and rate-⅚ encoding. The LDPCC encoder is systematic. That is, it encodes an information block of size k, I=($i_0, i_1, \ldots, i_{(k-1)}$) into a codeword c of size n, c=($i_0, i_1, \ldots i_{(k-1)}, p_0, p_1, \ldots, p_{(n-k-1)}$), by adding n−k parity bits obtained so that $H \cdot c^T = 0$ where H is an (n−k)×n parity-check matrix.

Each of the parity-check matrices may be partitioned into square subblocks (submatrices) of size Z×Z. These submatrices are either cyclic-permutations of the identity matrix, or they are null submatrices. The cyclic-permutation matrix $P_i$ is obtained from the Z×Z identity matrix by cyclically shifting the columns to the right by i elements. The matrix $P_0$ is the Z×Z identity matrix. FIG. 7 illustrates examples (for a subblock size of 8×8) of cyclic-permutation matrices $P_i$ where i=0, 1, 5 in this example.

FIG. 8 shows a table of exemplary PPDU encoding parameters. The table provides the number of integer LDPCC codewords, $N_{CW}$, and LDPC codeword length, $L_{LDCP}$, given the number of available bits, $N_{avbits}$. In an exemplary embodiment, if $N_{avbits}$ is less than or equal to 648, then $N_{CW}$ is one and $L_{LDCP}$ is either 1296 or 648. If $N_{avbits}$ is between 648 and 1296, then $N_{CW}$ is one and $L_{LDCP}$ is either 1944 or 1296. If $N_{avbits}$ is between 1296 and 1944, then $N_{CW}$ is one and $L_{LDCP}$ is 1944. If $N_{avbits}$ is between 1944 and 2592, then $N_{CW}$ is two and $L_{LDCP}$ is 1944 or 1296. If $N_{avbits}$ is greater than 2592, then $N_{CW}$ is ceil($N_{pld}$/(1944×R)), where ceil($N_{pld}$/(1944×R)) is the smallest integer value that is greater than or equal to $N_{pld}$/(1944×R), and $L_{LDCP}$ is 1944, where $N_{pld}$ is the number of bits in the PSDU and SERVICE fields.

FIG. 9 displays an exemplary embodiment of a parity-check matrix for code rate ¾ at blocklength n=648 bits. Vacant entries of the table denote null (zero) submatrices. Columns in the matrix can appear in any order, without changing the code. Shuffling the column while maintaining the integrity of the individual columns does not affect the output of the coding operation. FIG. 10 displays the matrix prototype of parity-check matrix for code rate ¾ at blocklength n=1296 bits, in similar fashion to that shown in FIG. 9. FIG. 11 displays the matrix prototype of parity-check matrix for code rate ¾ at blocklength n=1944 bits, in similar fashion to that shown in FIGS. 9 and 10.

Figure 12:
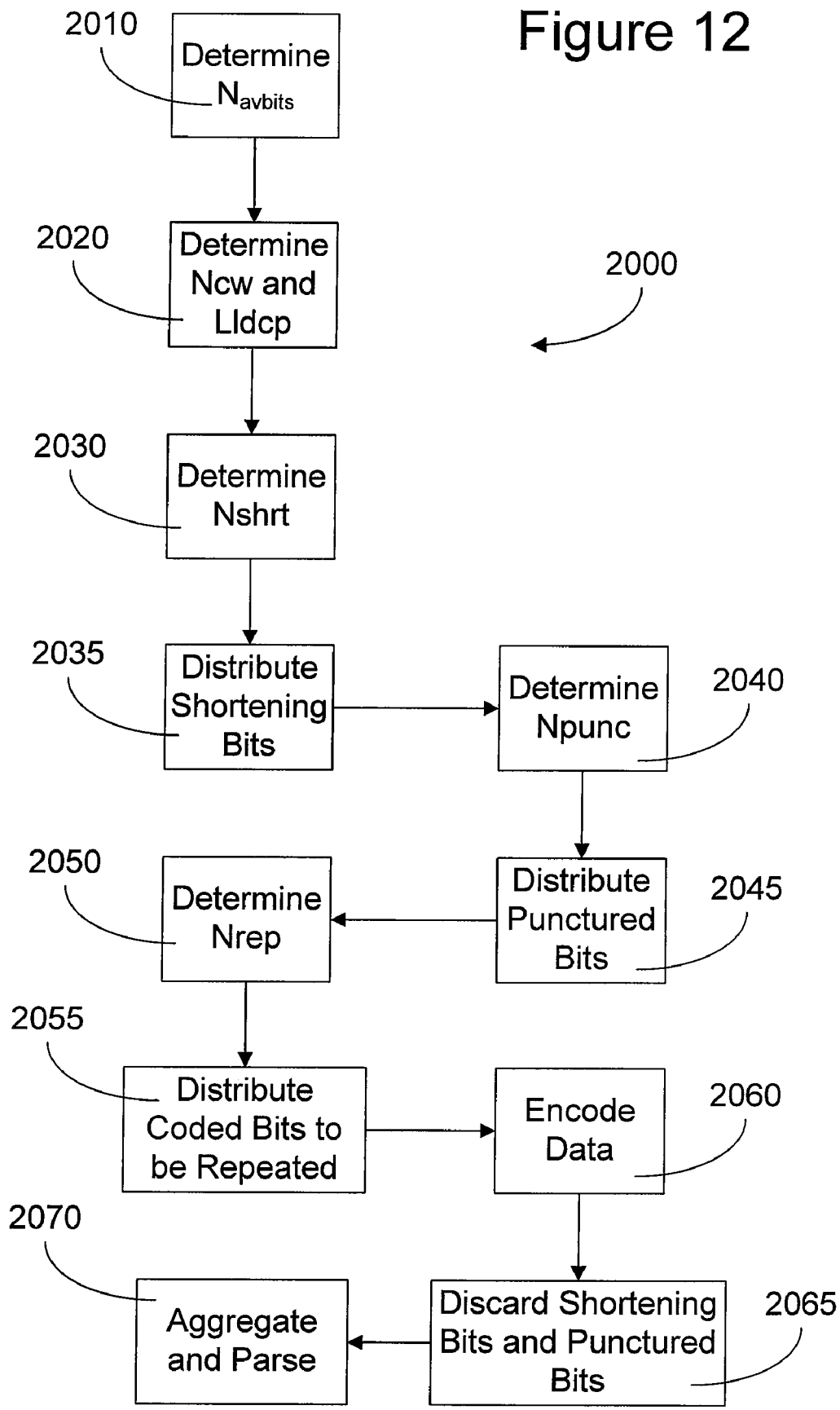
FIG. 12 is a flow chart of an exemplary embodiment of a method of LDPC coding in a digital transmission system.

As provided in FIG. 12, a method 2000 of LDPC coding is performed in sequence in blocks 2010-2070. In block 2010, the number of available bits in the minimum number of OFDM symbols in which data field 402 of packet 400 of FIG. 4 may fit is determined, where $$N_{pld} = (\text{length} \times 8) + 16$$

$$N_{avbits} = N_{CBPS} \times (1 + U_{STBC}) \times ceil\left(\frac{N_{pld}}{N_{CBPS} \times R \times (1 + U_{STBC})}\right).$$

$U_{STBC}$ is 1 when a space-time block-code (STBC) is used and 0 otherwise, $N_{CBPS}$ is the number of coded bits per OFDM symbol, and length is the value of the length field in a high throughput signal field. In block 2020, the integer number of LDPCC codewords to be transmitted, $N_{CW}$, and the length of the codewords to be used, $L_{LDCP}$, is determined using table 500 in FIG. 6. In block 2030, the number of shortening bits to be padded to the $N_{pld}$ data bits before encoding is determined where $$N_{shrt} = (N_{CW} \times L_{LDCP} \times R) - N_{pld}.$$

The shortening bits may be equally distributed over all $N_{CW}$ codewords with the first rem ($N_{shrt}$, $N_{CW}$) codewords being shortened one bit more than the remaining codewords, where rem ($N_{shrt}$, $N_{CW}$) refers to the remainder of $N_{shrt}$ when divided by $N_{CW}$. All shortened bits may be set to 0 on the right of the data bits in the systematic portion of the codeword corresponding to their locations in the parity-check matrix. In block 2035, these shortened bits may be distributed for encoding in block 2060.

In block 2040, the number of bits to be punctured from the codewords after encoding is determined, where $$N_{punc} = \max(0, (N_{CW} \times L_{LDCP}) - N_{avbits} - N_{shrt}).$$

If (($N_{punc}$>0.1 ×$N_{CW}$×$L_{LDCP}$×(1−R))) AND ($N_{SHRT}$<1.2× $N_{punc}$×R/(1−R)) is true or if ($N_{punc}$>0.3×$N_{CW}$×$L_{LDCP}$×(1−R)) is true, $N_{avbits}$ is incremented and $N_{punc}$ is recomputed by the following:

$$N_{avbits} = N_{avbits} + N_{CBPS} \times (1 + U_{STBC})$$

$$N_{punc} = \max(0, (N_{CW} \times L_{LDCP}) - N_{avbits} - N_{shrt}), \text{ where } N_{CBPS}$$

is the number of coded bits per OFDM symbol.

In block 2045, the punctured bits may be equally distributed over all $N_{CW}$ codewords with the first rem ($N_{punc}$, $N_{CW}$) codewords being punctured one bit more than the remaining codewords. These punctured bits may be the rightmost parity portion of the codeword corresponding to their locations in the parity-check matrix and may be discarded after encoding. The number of OFDM symbols to be transmitted in the PPDU can be computed by equation $N_{SYM} = N_{avbits}/N_{CBPS}$.

In block 2050, the number of coded words to be repeated, $N_{rep}$, is determined, where $N_{rep} = \max(0, N_{avbits} - N_{CW} \times L_{LDCP} \times (1-R) - N_{pld})$. In block 2055, the number of coded bits to be repeated may be equally distributed over all $N_{CW}$ codewords with the first rem ($N_{rep}$, $N_{CW}$) codewords containing one more repeated bit than the remaining codewords, where rem ($N_{shrt}$, $N_{CW}$) refers to the remainder of $N_{shrt}$ when divided by $N_{CW}$. When puncturing occurs, coded bits are not repeated. The coded bits to be repeated per codeword shall be copied (cyclically repeated when necessary) starting from the leftmost systematic data bits, continuing through the parity bit if necessary, corresponding to their locations in the parity-check matrix. These repeated bits are then concatenated to the codeword after the parity bits in their same order.

In block 2060, the data is encoded using an LDPCC encoder sequence and using the parity check matrices from FIGS. 7-15, the number of shortening bits per codeword as computed in block 2030, and puncture or repeat bits per codeword as computed in block 2040 and block 2050. In block 2065, the shortening and punctured bits may be discarded after encoding in block 2060. In block 2070, all codewords are aggregated and then parsed with LDPC parser.

The LDPC shortened and punctured codewords that result from the encoding process are outputted in sequential fashion starting from the $i_0$th bit of the systematic portion of each encoded codeword. The parsing of this encoded data stream into spatial streams may follow parsing rules as defined for a binaural cue coding (BCC) encoder.

Any process descriptions or blocks in flow charts should be understood as representing modules, segments, or portions of code which include one or more executable instructions for implementing specific logical functions or steps in the process, and alternate implementations are included within the scope of the exemplary embodiments of the present disclosure in which functions may be executed out of order from that shown or discussed, including substantially concurrently or in reverse order, depending on the functionality involved, as would be understood by those reasonably skilled in the art of the present disclosure.

Shortening comprises encoding larger size messages into smaller size messages using, as an example, a (k-to-n) cookbook, by fixing a number of information bits to known bit values, for example, "0," which are not transmitted. These bits may be referred to a shortening bits. The rate of the code is effectively reduced in this manner. These shortening bits are known by the encoder and decoder; so the decoder already knows some of the information perfectly without it being transmitted, resulting in more effective coding. It is a matter of predefining the information bits to a known value and then not transmitting those bits. At the receive side, the decoder simply fills in those bits of which it has knowledge. Shortening algorithms disclosed herein may be applicable to any payload data size.

As a non-limiting example, for an (n,k)=(8,4) systematic code as a base code, four message bits (m1, m2, m3, m4) are encoded into eight codeword bits (m1, m2, m3, m4, p1, p2, p3, p4) where p1, p2, p3, p4 are the parity bits and are functions of the message bits (m1, m2, m3, m4). If the base code is applied to a message of six bits, (m1, m2, m3, m4, m5, m6) the first four can be encoded, resulting in (m1, m2, m3, m4, p1, p2, p3, p4). To encode (m5, m6), two extra bits are needed, so two shortening bits, m7 and m8 are employed and are set to zero. Therefore m5 and m6 are encoded into (m5, m6, 0, 0, p5, p6, p7, p8). However, the two zeros are not transmitted since the decoder is compliant with the shortening algorithm. In this example, two codewords are needed to transmit 6 bits—the first, a regular codeword of 8 bits; the second—a shortened codeword of 6 bits.

An alternative embodiment includes setting m4 and m8 to zero: (m1, m2, m3, p1, p2, p3, p4) and (m5, m6, m7, p5, p6, p7, p8). In this embodiment, the two codewords are balanced. To achieve balanced codewords, after the shortening is performed, puncturing may be performed. The puncturing may be performed from the rightmost parity portion of the codeword. So in the above example, if one bit is to be punctured from each codeword, then p4 and p8 are punctured. Now, the first codeword is (m1, m2, m3, p1, p2, p3) and the second codeword is (m5, m6, m7, p6, p7).

In an exemplary embodiment, suppose that a PSDU of 1500 data bits is to be transmitted in a non-STBC scenario where each OFDM symbol comprises $N_{CBPS}=208$ coded bits encoded with a rate-¾ LDPCC encoder. The total number of payload bits is therefore $N_{pld}=1500+16=1516$. To establish the encoding, first, a $N_{avbits}$ is computed as $N_{avbits}=(N_{CBPS}) \times$ ceil $(N_{pld}/(N_{CBPS} \times R))=2080$. Since $N_{avbits}$ is greater than 1944 and less than 2592, from FIG. 7, the number of codewords is $N_{CW}=2$. Moreover, since $N_{avbits}$ is less than $N_{pld}+2916(1-R)=2245$, the codeword length is $L_{LDCP}=1296$ bits. The number of shortening bits is computed to be $N_{shrt}=2 \times 1296 \times (¾)-1516=428$. This indicates that each of the two codewords will be encoded with 428/2=214 shortening bits. The number of puncturing bits is then computed using $N_{punc}=\max(0, (N_{CW} \times L_{LDCP})-N_{avbits}-N_{shrt})$, where $N_{CBPS}$ is the number of coded bits per OFDM symbol, resulting in $N_{punc}=84$. This indicates that each of the two codewords will undergo 84/2=42 bits of puncturing.

The incoming message of 1516 bits is therefore divided into two 758-bit groups. Each group is then appended with 214 "zero bits" to produce a message word of 1296 bits. Each of the 1296-bit messages is then encoded using a 1296-bit codeword. The shortened bits (214 from each) are discarded to yield two 1082-bit shortened codewords. Each codeword is then punctured by 42 bits to produce 1040-bit final codewords. The number of OFDM symbols to be transmitted is computed as $N_{SYM}=N_{avbits}/N_{CBPS}=10$. Each codeword occupies 5 OFDM symbols.

Without the restrictions of number of bits per OFDM symbol and integer number of OFDM symbols, the encoding of 1516 bits via a rate-¾ encoder would result in 2022 bits. This exemplary embodiment results in minimum channel occupation (OFDM symbols) by adding minimum redundancy for a range of packet-byte values, the extra redundancy being less than six bits per OFDM symbol.

In an exemplary embodiment, LDPC codes with three distinct blocklengths may be utilized to encode data for a packet in the LDPC mode. Not all three blocklengths are necessarily used for all packets. In one implementation a 648-bit codeword may be the shortest blocklength. In one embodiment, there may be four encoder rates for each blocklength. For rate-¾ encoding, an exemplary embodiment of a method for LDPC coding in a digital transmission system as disclosed herein may encode 486 data bits into 648 coded bits, for example. In the LDPC mode, a data burst with 486 or fewer bits may be effectively encoded using this method. This method may also be used for end-of-packet encoding for some packet lengths.

It should be emphasized that the above-described embodiments of the present disclosure are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

The invention claimed is:

1. A method comprising:
    determining, at a station, a number of available bits to be transmitted in a plurality of orthogonal frequency-division multiplexed (OFDM) symbols of a packet;
    determining, at the station, an integer number of low density parity check coded (LDPCC) codewords to be transmitted, and a length of the LDPCC codewords to be transmitted;
    determining a number of shortening bits per LDPCC codeword;
    encoding each of the available bits into the integer number of LDPCC codewords, wherein the shortening bits per LDPCC codeword are distributed to each of the integer number of LDPCC codewords;
    determining a number of bits for re-encoding the encoded LDPCC codewords;
    re-encoding the encoded LDPCC codewords based on the number of bits for re-encoding; and
    transmitting the re-encoded LDPCC codewords via the station.

2. The method of claim 1, wherein determining the number of bits for re-encoding comprises determining a number of coded bits to be repeated; and
    wherein re-encoding the encoded LDPCC codewords comprises adding the number of coded bits to each of the encoded LDPCC codewords.

3. The method of claim 2, wherein determining the number of coded bits comprises taking a maximum between zero and a number of coded words to be repeated, wherein the number of coded words is determined by:
    subtracting the number of available bits from a product of a codeword length, the integer number of code words, and a difference between one and an encoding rate, and then
    subtracting a number of data bits to be encoded.

4. The method of claim 1, wherein transmitting the re-encoded LDPCC codewords comprises:
    sequentially outputting the re-encoded LDPCC codewords as an encoded data stream; and
    parsing the encoded data stream into a spatial stream using a binaural cue coding (BCC) encoder.

5. The method of claim 1, wherein determining the number of bits for re-encoding comprises determining the number of bits for re-encoding the encoded LDPCC codewords such that a maximum difference in the number of bits for re-encoding between any two of the encoded LDPCC codewords is one bit.

6. The method of claim 5, wherein determining the number of bits for re-encoding comprises determining a number of puncturing bits; and
    wherein re-encoding the encoded LDPCC codewords comprises puncturing the encoded LDPCC codewords by balancing the encoded LDPCC codewords such that a maximum difference in the number of puncturing bits between any two encoded LDPCC codewords is one bit.

7. The method of claim 6, wherein determining the number of puncturing bits comprises multiplying the integer number of LDPCC codewords by a codeword length.

8. The method of claim 7, wherein determining the number of puncturing bits comprises ensuring that the number of puncturing bits is greater than or equal to zero.

9. The method of claim 1, wherein determining the integer number of LDPCC codewords to be transmitted comprises rounding a ratio of the number of available bits to a codeword length to the next larger integer number.

10. The method of claim 9, wherein determining the number of shortening bits per LDPCC codeword comprises multiplying the integer number of LDPCC codewords, the codeword length, and an encoder rate.

11. The method of claim 1, further comprising discarding the shortening bits per LDPCC codeword.

12. The method of claim 1, wherein the shortening bits per LDPCC codeword are each fixed to a known bit value.

13. A tangible computer readable storage medium having instructions stored thereon, the instructions comprising:
   logic configured to determine a number of available bits to be transmitted in a plurality of orthogonal frequency-division multiplexed (OFDM) symbols of a packet;
   logic configured to determine an integer number of low density parity check coded (LDPCC) codewords to be transmitted, and a length of the LDPCC codewords to be transmitted;
   logic configured to determine a number of shortening bits per LDPCC codeword;
   logic configured to encode each of the available bits into the integer number of LDPCC codewords, wherein the shortening bits per LDPCC codeword are distributed to each of the integer number of LDPCC codewords;
   logic configured to determine a number of bits for re-encoding the encoded LDPCC codewords
   logic configured to re-encode the encoded LDPCC codewords based on the number of bits for re-encoding; and
   logic configured to transmit the re-encoded LDPCC codewords.

14. The tangible computer readable storage medium of claim 13, wherein the logic configured to determine the number of bits for re-encoding comprises logic configured to determine a number of coded bits to be repeated; and
   wherein the logic configured to re-encode the encoded LDPCC codewords comprises logic configured to add the number of coded bits to each of the encoded LDPCC codewords.

15. The tangible computer readable storage medium of claim 14, wherein the logic configured to determine the number of coded bits comprises logic configured to take a maximum between zero and a number of coded words to be repeated, wherein the number of coded words is determined by:
   subtracting the number of available bits from a product of a codeword length, the integer number of code words, and a difference between one and an encoding rate, and then
   subtracting a number of data bits to be encoded.

16. The tangible computer readable storage medium of claim 13, wherein the logic configured to transmit the re-encoded LDPCC codewords comprises:
   logic to sequentially output the re-encoded LDPCC codewords as an encoded data stream; and
   logic to parse the encoded data stream into a spatial stream.

17. The tangible computer readable storage medium of claim 13, wherein the logic configured to determine the number of bits for re-encoding comprises logic configured to determine the number of bits for re-encoding the encoded LDPCC codewords such that a maximum difference in the number of bits for re-encoding between any two of the encoded LDPCC codewords is one bit.

18. The tangible computer readable storage medium of claim 17, wherein the logic configured for determining the number of bits for re-encoding comprises logic for determining a number of puncturing bits; and
   wherein the logic for re-encoding the encoded LDPCC codewords comprises logic configured to puncture the encoded LDPCC codewords by balancing the encoded LDPCC codewords such that a maximum difference in the number of puncturing bits between any two encoded LDPCC codewords is one bit.

19. The tangible computer readable storage medium of claim 18, wherein the logic configured to determine the number of puncturing bits comprises logic for multiplying the integer number of LDPCC codewords by a codeword length.

20. The tangible computer readable storage medium of claim 19, wherein the logic configured to determine the number of puncturing bits comprises logic configured to ensure the number of puncturing bits is greater than or equal to zero.

21. The tangible computer readable storage medium of claim 13, wherein the logic configured to determine the integer number of LDPCC codewords to be transmitted comprises logic configured to round a ratio of the number of available bits to a codeword length to the next larger integer number.

22. The tangible computer readable storage medium of claim 21, wherein the logic configured to determine the number of shortening bits per LDPCC codeword comprises logic configured to multiply the integer number of LDPCC codewords, the codeword length, and an encoder rate.

23. The tangible computer readable storage medium of claim 13, further comprising logic configured to discard the shortening bits per LDPCC codeword.

24. The tangible computer readable storage medium of claim 13, wherein each of the shortening bits per LDPCC codeword is fixed to a known bit value.

25. A station, comprising:
   a processor configured to:
      determine a number of available bits to be transmitted in a plurality of orthogonal frequency-division multiplexed (OFDM) symbols of a packet;
      determine an integer number of low density parity check coded (LDPCC) codewords to be transmitted, and a length of the LDPCC codewords to be transmitted;
      determine a number of shortening bits per LDPCC codeword;
      encode each of the available bits into the integer number of LDPCC codewords, wherein the shortening bits per LDPCC codeword are distributed to each of the integer number of LDPCC codewords;
      determine a number of bits for re-encoding the encoded LDPCC codewords;
      re-encode the encoded LDPCC codewords based on the number of bits for re-encoding; and
      transmit the re-encoded LDPCC codewords.

26. The station of claim 25, wherein the processor is further configured to determine a number of coded bits to be repeated.

27. The station of claim 26, wherein the processor configured to determine the number of coded bits comprises a processor configured to take a maximum between zero and a number of coded words to be repeated, wherein the number of coded words is determined by:

subtracting the number of available bits from a product of a codeword length, the integer number of code words, and a difference between one and an encoding rate, and then subtracting a number of data bits to be encoded.

28. The station of claim 25, wherein the processor configured to transmit the re-encoded LDPCC codewords comprises a processor configured to:

sequentially output the re-encoded LDPCC codewords as an encoded data stream; and parse the encoded data stream into a spatial stream.

29. The station of claim 25, wherein the processor configured to determine the number of bits for re-encoding comprises a processor configured to determine the number of bits for re-encoding the encoded LDPCC codewords such that a maximum difference in the number of bits for re-encoding between any two of the encoded LDPCC codewords is one bit.

30. The station of claim 29, wherein the processor configured to determine the number of bits for re-encoding is configured to determine a number of puncturing bits; and wherein the processor configured to re-encode the encoded LDPCC codewords comprises a processor configured to puncture the encoded LDPCC codewords by balancing the encoded LDPCC codewords such that a maximum difference in the number of puncturing bits between any two encoded LDPCC codewords is one bit.

31. The station of claim 30, wherein the processor configured to determine the number of puncturing bits comprises a processor configured to multiplying the integer number of LDPCC codewords by a codeword length.

32. The station of claim 31, wherein the processor configured to determine the number of puncturing bits comprises a processor configured to ensure the number of puncturing bits is greater than or equal to zero.

33. The station of claim 25, wherein the processor configured to determine the integer number of LDPCC codewords to be transmitted comprises a processor configured to round a ratio of the number of available bits to a codeword length to the next larger integer number.

34. The station of claim 33, wherein the processor configured to determine the number of shortening bits per LDPCC codeword comprises a processor configured to multiply the integer number of LDPCC codewords, the codeword length, and an encoder rate.

35. The station of claim 25, wherein the processor is further configured to discard the shortening bits per LDPCC codeword.

36. The station of claim 25, wherein each of the shortening bits per LDPCC codeword is fixed to a known bit value.

* * * * *

UNITED STATES PATENT AND TRADEMARK OFFICE
CERTIFICATE OF CORRECTION

| | |
|---|---|
| PATENT NO. | : 7,861,134 B2 |
| APPLICATION NO. | : 11/680612 |
| DATED | : December 28, 2010 |
| INVENTOR(S) | : Kose |

It is certified that error appears in the above-identified patent and that said Letters Patent is hereby corrected as shown below:

Column 13, line 38, in Claim 13, delete "codewords" and insert -- codewords; --.

Signed and Sealed this
Twenty-fourth Day of May, 2011

David J. Kappos
*Director of the United States Patent and Trademark Office*